Nov. 29, 1966 F. M. YOUNG 3,289,094

DIFFERENTIAL AMPLIFIER

Original Filed Nov. 13, 1961 2 Sheets-Sheet 1

INVENTOR
FRINK MANSFIELD YOUNG
BY Kenway, Jenney & Hildreth
ATTORNEYS

INVENTOR
FRINK MANSFIELD YOUNG
BY Kenway, Jenney & Hildreth
ATTORNEYS

United States Patent Office 3,289,094

Patented Nov. 29, 1966

3,289,094
DIFFERENTIAL AMPLIFIER

Frink Mansfield Young, Boston, Mass., assignor to Adage, Inc., Boston, Mass., a corporation of Massachusetts Continuation of application Ser. No. 151,849, Nov. 13, 1961. This application June 3, 1965, Ser. No. 461,128
7 Claims. (Cl. 330—69)

This case is a continuation of U.S. application Serial Number 151,849 filed November 13, 1961 and assigned to the assignee of the present invention, now abandoned.

My invention relates to an improved difference amplifier. More particularly it relates to an improved difference amplifier for direct voltages having high input impedance and a high common mode rejection.

Difference amplifiers are devices which receive a pair of input signals and provide an output signal which is proportional to the difference between these input signals. One of the desired properties of difference amplifiers is that they have high common mode rejection. This term refers to the ability of the amplifier to reject signals common to both input signals and reproduce only the difference between the two input signals. In numerous applications of difference amplifiers the common signal may be many, many times as large as the difference signal. It is therefore important that difference amplifiers be unaffected by the presence of large signals at their input terminals. It is further important that they provide high input impedance, not only to prevent loading of the signal sources but also to aid in achieving good common mode rejection. If their input impedance is comparable to that of the signal sources, and the source impedances are different, a difference signal will be generated by the different effect of the input impedance on the two sources. Further, it is desirable to provide stable, drift free operation in amplifiers of this type.

Prior to my invention, difference amplifiers were generally made by utilizing a pair of triode vacuum tubes connected to a common source of plate supply voltage and heater power. A common cathode impedance was also usually provided. The two input signals were connected between the respective grids of the two triodes and the common reference potential, the reference potential being usually ground. The output difference signal was measured between the two plates of the triodes. Since this difference signal was at a fairly high potential (the plate potentials of the two tubes) another direct voltage amplifier was generally provided to convert the difference signal to a signal with respect to the reference potential.

Amplifiers of the type described had several problems. One of these was differences in parameters of the two tubes and another was differences in the values of circuit elements. If the tubes or non-common circuit elements were not perfectly matched, the two halves of the amplifier would amplify differently with the result that common signals would not be completely rejected. Further, even though care in selection of components was used and the amplification of the two channels was reasonably the same for small signals, non-linearities which occurred when the common mode signal was large would cause differences in amplification.

Refinements have been made in the basic amplifier described above to obviate these problems. One of these refinements consisted in feeding back the output difference signal to the grid of one of the two triodes. The difference between the signal appearing on the grid of this triode and that on the grid of the other triode was used after chopping and amplification to adjust the current through each of the triodes to that value which produced an output signal which when subtracted from one input signal, exactly equalled the other. While this circuit provided an improved difference amplifier, the gain of the channels was still dependent on the values of the resistors used between input terminal and grid and between output terminal and grid. Variations in the values of these components with variations in temperature or humidity would result in gain changes in the amplifier. Further, the input impedance of each amplifier was limited to the sum of this input and feedback resistance. Thus, while this amplifier represented an improvement over earlier difference amplifiers it was not wholly satisfactory for use where extremely high common mode rejection was desired with great stability of operation.

Accordingly, it is a principal object of my invention to provide an improved difference amplifier.

A further object of my invention is to provide a difference amplifier which produces a current dependent on the difference in the two input signals rather than a voltage.

A still further object of my invention is to provide a difference amplifier of the type described having a high input impedance, and in which the two input signals are amplified in channels in which the gain is not dependent on component values. Yet a further object of my invention is to provide a difference amplifier utilizing, in a preferred embodiment, the new and improved signal amplifier described in my copending application Serial No. 25,086, now U.S. Patent No. 3,233,185 (which is assigned to the assignee of the present application).

Other and further objects of my invention will in part be obvious and will in part appear hereinafter.

The invention accordingly comprises the features of construction, combination of elements, and arrangement of parts which will be exemplified in the construction hereinafter set forth, and the scope of the invention will be indicated in the claims.

For a fuller understanding of the nature and objects of the invention, reference should be had to the following detailed description taken in connection with the accompanying drawings in which.

Figure 1:
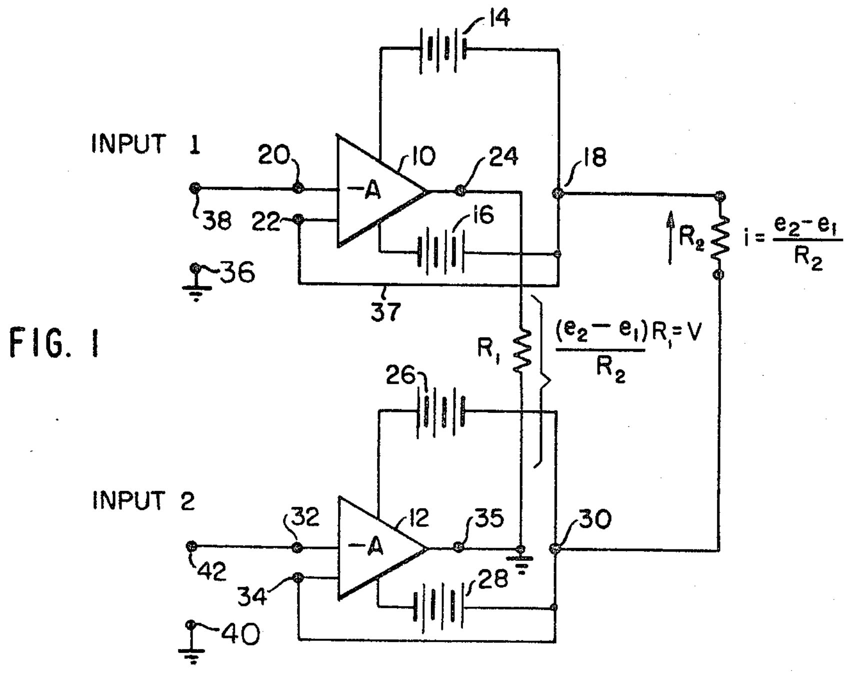
FIG. 1 is a block and line diagram of a difference amplifier made according to my invention, utilizing conventional amplifiers.

In general, in difference amplifiers of my invention, I provide two signal channels, each including an amplifier. The active output terminals of the two amplifiers are connected together through a resistor. If the output signals from the two amplifiers are different a current will flow through this resistor.

The power supply (including both positive and negative voltage sources) for at least one of the amplifiers is not returned to ground (or other reference potential) directly but through a second resistor. Then the same current flowing between the two amplifier output terminals must also flow through this second resistor. The output voltage may be taken across the first resistor if a "single-ended" output signal is desired or may be taken across the second resistor if a "double-ended" output is desired. The first resistor may also serve as the input resistor of the next following stage.

I prefer to use high gain amplifiers for each channel employing unity feedback, so that each channel gain is unity. Using inverse feedback, such amplifiers are not dependent upon component values to maintain their gain at exactly one. The large negative feedback in connection with a high amplifier gain results in a very high input impedance for each channel. As noted the fact that the gain in each channel is not dependent on component values, and the individual input impedance to each channel is high, results in very high rejection of common mode signals.

In describing my invention in detail reference will first be made to the diagram of FIG. 1. As shown therein, the improved difference amplifier of my invention has two channels, each including an amplifier 10 and 12. These amplifiers are conventional direct coupled voltage amplifiers of extremely high gain. Each of the amplifiers is supplied with power from a power supply (here shown illustratively as a pair of batteries). Thus, positive voltage is supplied to the amplifier 10 from the positive power supply 14 and negative voltage from the negative power supply 16. These power supplies supply operating potentials to the amplifier and are connected to the active elements in the amplifier in a known fashion as determined by the particular circuitry incorporated in the amplifier 10. It will be observed that these power supplies are not grounded but are returned to a reference terminal 18. The amplifier 10 is provided with a pair of input terminals 20 and 22 and the output signal of this amplifier appears between the active output terminal 24 of amplifier 10 and the reference terminal 18. The input reference terminal 22 and the output reference terminal 18 of the amplifier 10 are connected directly together by a lead 37.

In exactly similar fashion, the amplifier 12 in the lower signal channel is supplied with power from positive power supply 26 and negative power supply 28 which are both returned to the reference terminal 30. The terminal 30 corresponds to the terminal 18 of the upper signal channel. The amplifier 12 has input terminals 32 and 34 corresponding to the terminals 20 and 22 of the amplifier 10 and an active output terminal 35 corresponding to terminal 24 of the amplifier 10.

Two pairs of input terminals are provided, one for each channel. The terminals for the upper channel are indicated at 36 and 38 and for the lower channel at 40 and 42. The voltage sources whose difference signal is to be amplified usually have a common reference terminal, and this common or reference terminal for each of the voltage sources is connected to the terminals 36 or 40 as the case may be. To this end, it will be observed that the terminals 36 and 40 may be connected together within the amplifier. The terminals 38 and 42 are connected to the active input terminals 20 and 32 respectively of the amplifiers 10 and 12. This is a conventional circuit utilizing inverse feedback with a high gain amplifier which has an overall phase or polarity inversion to produce a unity gain amplifier having a very high input impedance, low output impedance and great stability.

The active output terminals 24 and 35 are connected together through a resistor, here shown as resistor $R_1$. In a similar fashion, the reference terminals 18 and 30 are connected together by a resistor $R_2$. $R_1$ may be a separate resistor provided internally within the amplifier, or it may be the input impedance of the next succeeding stage which is to utilize the differential amplifier output signal as will be more fully explained below. One of the terminals 24 or 35, which terminals are in effect the output terminals of the differential amplifier, may be connected to a source of reference potential. Illustratively, in FIG. 1, terminal 35 is connected to ground.

In operation, a pair of signals whose difference is to be ascertained are connected between the terminals 36–38 and 40–42 respectively. Each of these amplifiers has a gain of —A, the minus indicating a phase or polarity inversion and A being a relatively large number, preferably of the order of 10,000 or greater. If the sum of these signals is other than zero, the amplifier will amplify the sum (which is actually a difference because of the polarity inversion) until the signal appearing between the terminals 24 and 35 or 18 and 30 is proportional to this sum.

Thus, when a signal source is connected between the terminals 36 and 38, the amplifier 10 is in effect a unity gain direct coupled amplifier with inverse feedback. Because high gain amplifiers are used in each of the channels, the input impedance between the terminals 36–38 and 40–42 will be extremely high. It will also be observed, that the unity gain of the individual channels is not dependent upon the value of any components. It is dependent only on the amplification of the amplifiers 10 and 12 being high; it is well known that if these amplifiers have very high gain, unity amplification can be achieved to an extremely high degree of precision.

If there is a difference between the two signals appearing at the terminals 18 and 30, a current *i* will flow in the resistor $R_2$ which is dependent upon this difference signal, the magnitude of the current being, as indicated on the drawing, the difference of voltage appearing at these terminals divided by the resistor $R_2$. As was previously explained, this current is equal to the current flowing through the resistor $R_1$ since the power supplies 14 and 16 are floating with respect to ground. This current generates an output voltage across $R_2$ for single-ended outputs and across $R_1$ for double-ended outputs. As is known, the output impedance of high gain feedback amplifiers of the type provided in each of the two channels is very low so that $R_1$ need be a resistor of sufficient magnitude that the output impedance of each of the channels is very small with respect to it. The resistor $R_2$ should also be chosen so that the current drain on the power supply is limited to a reasonable value since the current flowing through the resistor $R_2$ is supplied by the power supply 14 and 28 if the terminal 24 is positive with respect to terminal 35 and by power supply 26 and 16 if terminal 35 is positive with respect to terminal 24. The current supplied by these power supplies will flow from the reference terminal 30 toward terminal 18 if terminal 24 is positive with respect to terminal 35 and in the reverse direction if the reverse polarity is obtained. The current flowing between the terminals 18 and 30 will be exactly equal to that flowing between terminals 24 and 35. This current may be passed through a resistor such as resistor $R_1$ to provide an output voltage V equal to the difference in amplitude of the two input signals. The resistor $R_1$ may be the input impedance of the next succeeding stage which is to utilize the signal if appropriate or it may be provided within the amplifier.

Figure 3:
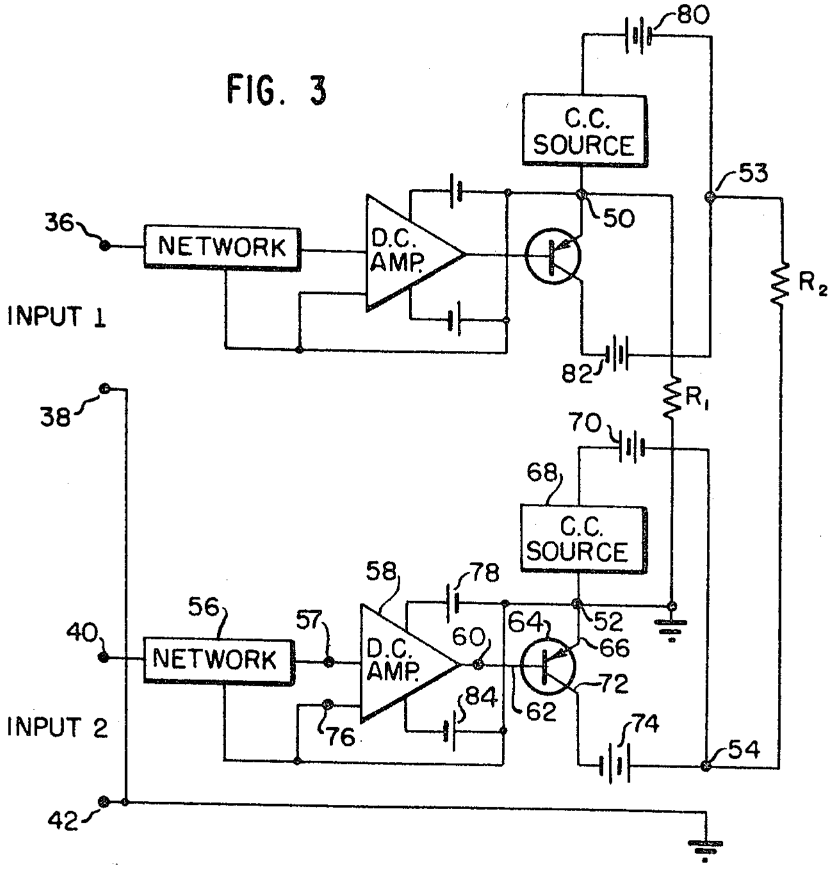
FIG. 3 is a block and line diagram of my improved difference amplifier utilizing the amplifiers disclosed in my copending application previously described.

Thus, it will be seen that the amplifier of FIG. 1 provides an output current flowing between the terminals 18 and 30 which is exactly proportional to the difference between the two input signals. It will be observed that this output current is in no way dependent upon component values which are not common to both channels. Thus, variation in components cannot effect the two channels differently thus providing a high common mode rejection. The high input impedance for the individual channels also assists in providing a high common mode rejection. A number of known amplifiers can be used for amplifiers 10 and 12 and for this reason no particular amplifier design is illustrated in FIG. 1. In FIG. 3 I have illustrated a preferred embodiment of my invention utilizing the amplifier described in my copending application previously referred to.

In some applications, one of the signal sources may have an extremely low output impedance so that the high gain amplifier associated with its channel may be omitted. Under these circumstances, the amplifier may take the configuration shown in FIG. 2. In the circuit there shown, the input terminal 40 is connected directly to one end of resistor $R_1$ and the input terminal 42 is connected directly to one end of resistor $R_2$. The terminal 40 may be connected directly to ground if this is compatible with the signal source. The operation of the circuit is identical to that in FIG. 1 in that the current flowing through resistor $R_1$ is dependent upon the difference between the two input voltages. The current flowing through resistor $R_2$ is equal to that flowing through resistor $R_1$ but is in the opposite direction. Accordingly, the voltage appearing across resistor $R_2$ will be dependent upon the difference in the two signals.

Figure 2:
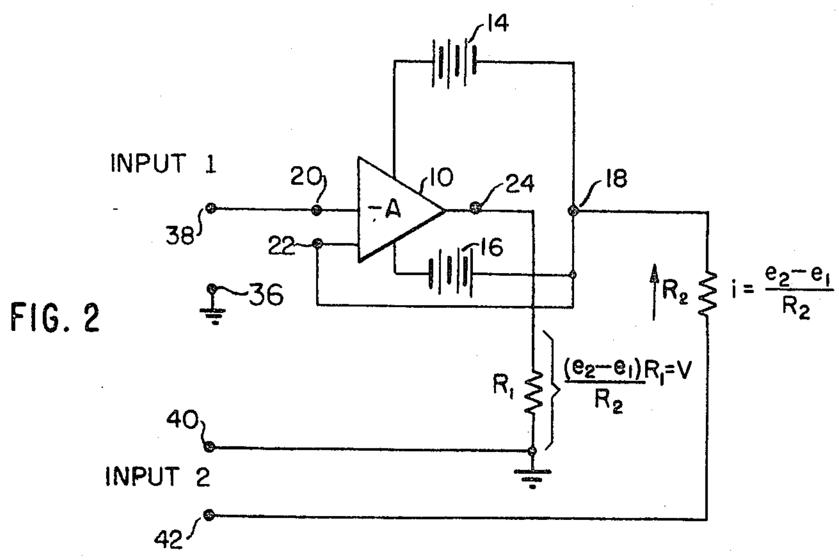
FIG. 2 is a block and line diagram of a simplified version of the circuit of FIG. 1 which is useful when at least one of the signal source impedances is low.

It will be observed that the circuits of FIGS. 1 and 2 and indeed the concept of my invention results in a voltage output (if resistor $R_1$ forms a part of the amplifier) which is "single-ended" i.e., is a voltage with respect to a reference potential which is usually ground. This is in contrast to difference amplifiers of the prior art in which the output was at a high direct voltage and had to be amplified by a direct-coupled amplifier to produce a single-ended output. However, the output impedance of the amplifier will of course be the value of resistor $R_1$ which may be higher than desirable. Accordingly, it may be necessary in utilizing my amplifier to follow it with a high input impedance device having a low output impedance such as a cathode or emitter follower circuit for example. This of course will depend upon the use to which the differential amplifier is put.

In FIG. 3 I have illustrated a preferred embodiment of my improved differential amplifier utilizing in each channel an amplifier of the type described in my copending application, Serial No. 25,086, entitled "Electrical Signal Amplifier." In this circuit, each of the channels is provided with an amplifier of the type described therein in detail and to be described in general below. While the general configuration of the amplifier will be described, it is to be understood, that a more complete description may be had by referring to the above-identified application.

As in the circuit of FIG. 1, two pairs of input terminals 36–38 and 40–42 are provided and the active output terminals 50 and 52 of each of the two channels are connected by a resistor $R_1$ which serves the same purpose as the resistor $R_1$ in the embodiment described in FIG. 1. The resistor $R_2$ is connected between the reference terminals for the power supplies for each of the channel amplifiers, the reference terminals being 53 and 54 respectively. The resistor $R_1$ is the resistor through which the output current flows, its magnitude depending upon the difference in the signals appearing at the terminals 36–38 and 40–42.

Referring to the amplifier in the lower channel of the drawing of FIG. 3, it will be seen that it includes a network 56 to which the terminal 40 is connected, the network in turn being connected to a direct voltage amplifier 58. The active output terminal 60 of the amplifier 58 is connected to the base 62 of the transistor generally indicated at 64. The emitter 66 of the transistor 64 is connected to a constant current source 68 which in turn is connnected to the positive power supply 70 (here shown for illustration as a battery). This power supply provides a potential between the reference terminal 54 and the constant current source 68. The collector 72 of the transistor 64 is connected to the negative power supply 74 also shown, by way of illustration, as a battery. Power input terminals 27 and 29 are provided, corresponding to those shown in FIGURE 1.

As so far described, the circuit is conventional. If the D.C. amplifier 58 were supplied from voltage sources referenced to the same terminal as the batteries 70 and 74, the signal input terminal 42 and the input terminal 76 of the D.C. amplifier were also connected to this terminal and a feedback loop around the D.C. amplifier were provided, a conventional circuit would be completed. However, as shown in FIG. 3, the supply voltages for the D.C. amplifier 58 are provided by direct voltage sources 78 and 84 (which are shown illustratively as batteries although other types of voltage sources might be used). The reference potential for the positive and negative voltage supply 78 and 84 is the potential of the active amplifier output terminal 52, rather than the terminal 54. Further, the common or inactive terminal 76 of the D.C. amplifier 58 together with any return from the network 56 are also connected to the output terminal 52. Hence, for the circuitry between the terminal 40 and the base 62 of the transistor 64, the reference or com-upon the difference between two input signals comprising, put stage power supplies 70 and 74 (terminal 54) as it is in conventional amplifier designs; rather it is the active output terminal 52 of the amplifier.

By utilizing the terminal 52 as the reference potential for the internal circuitry of the amplifier several important advantages are obtained. It will be observed that the active elements of the D.C. amplifier 58, which may be transistors for example, are not required to handle the total output voltage swing; only transistor 64 is required to do this. Since the transistors of the amplifier 58 are referenced to the output voltage, their required voltage excursion voltage is modest. This means that in the circuit shown, only the output transistor 64 is required to sustain a voltage swing comparable to the output voltage swing.

Another important advantage of the amplifier described is the very low leakage current. This leakage current is the current drawn by the amplifier from the circuit in which the voltage to be measured appears. For conventional circuits this current is proportional to the difference between the measured potential and the reference potential e.g., ground. However, in the circuit of FIG. 3, where both the network 56 and the amplifier 58 are referenced to the output potential, the only current which flows is proportional to the difference between measured and output potential. This current maintains, after amplification the appropriate signal on the base of transistor 64. The current is extremely small and therefore the amplifier has an extremely high input impedance. Further, because the potential for the circuit elements intermediate input terminal 40 and the base 62 of transistor 64 are all referenced to the output terminal 52, the amplifier inherently has unity negative feedback thus resulting in unity gain between the input terminals to the amplifiers 36 and 42 and the output terminals 53 and 54.

The amplifier shown in the upper channel of FIG. 3 is identical to that in the lower portion and will not be described in detail. The only difference between the upper channel of FIG. 3 and the lower channel is that the input terminal 38 is not connected to the reference terminal 53 for the power supplies 80 and 82. Instead it is connected in common with the input terminal 42.

The amplifier shown in FIG. 3, because of its design and construction, inherently has the necessary characteristics for use in my invention i.e. it has high impedance and unity gain which is not dependent on component values. For these reasons, the circuit of FIG. 3 constitutes a preferred embodiment of my invention. It will be understood of course that a single amplifier of the type illustrated in FIG. 3 may be used in a circuit like that of FIG. 2 if the application permits.

While I have described the difference amplifier of my invention in terms of channels having unity gain, it will be understood of course that amplifiers using feedback ratios other than unity may be used, although their use is not preferred. Thus, in the circuit of FIG. 1 a voltage divider might be inserted across the output terminals 24–18 and 35–30 of the amplifiers 10 and 12 so that only a portion of the output signal is fed back from the output of amplifiers 10 and 12 to the terminals 22 and 34. The output signal appearing between the output terminals of the amplifier will then be larger than the input signal by the inverse of the voltage division ratio e.g. if one half the output signal is fed back, the gain between input and output terminals will be 2. It is preferred to achieve gain by adjusting the ratio of the resistance $R_2$ to $R_1$, rather than by providing potentiometric amplifiers in the channels as described. As explained above, when amplifiers having other than unity gain are used, the rejection of common mode signals depends upon the precision of the values of the components used to establish the feedback ratio, and the values may vary, with time, temperature, humidity, etc.

As noted, the input impedance to each of the signal channels is quite high. Also the input impedance to difference signals is also quite high since this impedance is, in effect equal to the sum of the channel input impedance.

Thus I have provided an improved differential amplifier which provides an output current which is dependent upon the difference between two signals rather than an output voltage. In the preferred embodiment of the differential amplifier, each channel is provided with a high input impedance unity gain feedback amplifier. The active output terminals of these amplifiers are connected together through a resistance and the current flowing through this resistance is dependent upon the difference in input voltage. No current flows through this resistor as a result of voltages common to both channels since the channel gain is identical to a high degree of precision. The current flow through this common resistor is exactly equal to that flowing through a resistor connected between the power supply reference terminals of the amplifiers used in each channel and it is this current which is utilized to provide an output signal.

I have also illustrated how, under certain circumstances when one of the sources has a low output impedance, the amplifier in one of the channels may be eliminated.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Having described my invention, I claim:

1. A difference amplifier for electrical signals, said amplifier providing an output signal which is dependent upon the difference between two input signals comprising, in combination, first and second pairs of signal input terminals for connection to two separate input signals, an amplifier having an active input terminal, an active output terminal, and a reference terminal, means connecting a first terminal from said first pair of signal input terminals to the active input terminal of said amplifier, a direct current voltage supply means connected between said amplifier reference terminal and said amplifier for supplying operating potentials to said amplifier, a first electrical impedance, means connecting said impedance between the active output terminal of said amplifier and a second terminal of said second pair of signal input terminals, a second electrical impedance, means connecting said second impedance between said amplifier reference terminal and a first input terminal of the second pair of signal input terminals, means connecting each said second input terminal of said first and second pairs of signal input terminals and the end of said first impedance not connected to said amplifier active output terminal to a common reference potential, the current flowing through said impedances being directly proportional to the difference in the voltages applied to said pairs of signal input terminals.

2. The combination defined in claim 1 in which said electrical impedances are resistors.

3. A difference amplifier for electrical signals, said amplifier providing an output signal which is dependent upon the difference between two input signals comprising, in combination, first and second pairs of signal input terminals for connection to said input signals, first and second electrical signal amplifiers, each of said amplifiers having an active input terminal, an active output terminal, and a reference terminal, means connecting a first terminal of said first and second pairs of signal input terminals to the corresponding active input terminal of each of said signal amplifiers, first and second power supplies connected between the reference terminal of each of said amplifiers and each said amplifier to supply operating potentials thereto, a first electrical impedance connected between the active output terminals of said amplifiers, a second electrical impedance connected between the reference terminals of said amplifiers, and means connecting a second terminal of each of said first and second pairs of signal input terminals and the end of said first impedance not connected to said first amplifier active output terminal to a common reference potential, the current through said impedance being proportional to the difference in the signals applied to said first and second pairs of signal input terminals.

4. The combination defined in claim 3 in which each said signal amplifier includes an internal amplifier having an active input terminal, an active output terminal and a reference terminal, means connecting the active input terminal of each said internal amplifier to the corresponding active input terminal of each said signal amplifier, a power supply for each internal amplifier, means connecting each said power supply btween the reference terminal of each respective internal amplifier and said internal amplifier to supply operating potential thereto, an active controlled current flow device having at least three terminals, means connecting said internal amplifier active output terminal to a first of said terminals, means connecting said internal amplifier reference terminal to a second of said terminals, said second terminal serving as said signal amplifier active output terminal, said power supply for each said signal amplifier being connected between the respective reference terminals of each said signal amplifier and the second and third terminals of said controlled current flow device.

5. The combination defined in claim 3 in which the impedance connected between the active output terminals of said signal amplifiers is a resistor.

6. The combination defined in claim 5 in which each said amplifier is a high gain direct current amplifier.

7. The combination defined in claim 6 in which the feedback ratio for each said amplifier as connected is unity.

References Cited by the Examiner

UNITED STATES PATENTS

| | | | |
|---|---|---|---|
| 3,075,155 | 1/1963 | Reaves | 330—69 |
| 3,124,762 | 3/1964 | Reaves | 330—69 X |
| 3,168,708 | 2/1965 | Stuart-Williams et al. | 330—69 X |

ROY LAKE, *Primary Examiner.*

N. KAUFMAN, *Assistant Examiner.*